(12) United States Patent
Wang et al.

(10) Patent No.: US 9,591,753 B2
(45) Date of Patent: Mar. 7, 2017

(54) CIRCUIT BOARD AND MANUFACTURING METHOD THEREOF

(71) Applicant: Subtron Technology Co., Ltd., Hsinchu County (TW)

(72) Inventors: Chin-Sheng Wang, Hsinchu County (TW); Ching-Sheng Chen, Hsinchu County (TW); Mei-Chin Chang, Hsinchu County (TW); Ching-Ta Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 31 days.

(21) Appl. No.: 14/849,614

(22) Filed: Sep. 10, 2015

(65) Prior Publication Data

US 2017/0013710 A1   Jan. 12, 2017

(30) Foreign Application Priority Data

Jul. 9, 2015  (TW) ............................. 104122245 A (51) Int. Cl.
| | |
|---|---|
| *H05K 1/09* | (2006.01) |
| *H05K 1/11* | (2006.01) |
| *H05K 3/18* | (2006.01) |

(52) U.S. Cl.
CPC .............. *H05K 1/09* (2013.01); *H05K 1/111* (2013.01); *H05K 3/181* (2013.01); *H05K 3/188* (2013.01);
(Continued)

(58) Field of Classification Search
CPC ........... H05K 1/09; H05K 1/111; H05K 3/188
(Continued)

(56) References Cited

U.S. PATENT DOCUMENTS 8,987,910 B2* 3/2015 Ozkok ............. H01L 23/49866
                                                    257/762
9,089,062 B2* 7/2015 Janssen .................. C23C 18/36
(Continued)

FOREIGN PATENT DOCUMENTS

| JP | 2003023132 | 1/2003 |
|---|---|---|
| JP | 2008177261 | 7/2008 |

(Continued)

OTHER PUBLICATIONS

"Office Action of Taiwan Counterpart Application", issued on Feb. 17, 2015, p. 1-p. 7, in which the listed references were cited.
(Continued)

*Primary Examiner* — Timothy Thompson
*Assistant Examiner* — Charles Pizzuto
(74) *Attorney, Agent, or Firm* — Jianq Chyun IP Office (57) ABSTRACT

A circuit board includes a substrate, a patterned copper layer, a phosphorous-containing electroless plating palladium layer, an electroless plating palladium layer and an immersion plating gold layer. The patterned copper layer is disposed on the substrate. The phosphorous-containing electroless plating palladium layer is disposed on the patterned copper layer, wherein in the phosphorous-containing electroless plating palladium layer, a weight percentage of phosphorous is in a range from 4% to 6%, and a weight percentage of palladium is in a range from 94% to 96%. The electroless plating palladium layer is disposed on the phosphorous-containing electroless plating palladium layer, wherein in the electroless plating palladium layer, a weight percentage of palladium is 99% or more. The immersion plating gold layer is disposed on the electroless plating palladium layer.

10 Claims, 5 Drawing Sheets

(52) U.S. Cl.
CPC ........... *H05K 2201/0338* (2013.01); *H05K 2201/0344* (2013.01)

(58) Field of Classification Search
USPC .......................................... 174/257
See application file for complete search history.

(56) References Cited

U.S. PATENT DOCUMENTS

| | | | |
|---|---|---|---|
| 2007/0104929 A1* | 5/2007 | Yim | H05K 3/244 428/209 |
| 2008/0003351 A1* | 1/2008 | Kukanskis | H01C 17/24 427/98.8 |
| 2009/0017327 A1* | 1/2009 | Chen | C23C 2/02 428/632 |
| 2015/0009638 A1* | 1/2015 | Janssen | C23C 18/36 361/751 |
| 2015/0237736 A1* | 8/2015 | Iga | H05K 3/0014 174/255 |
| 2016/0060781 A1* | 3/2016 | Gloeden | H05K 3/246 205/212 |

FOREIGN PATENT DOCUMENTS

| | | |
|---|---|---|
| JP | 2008291348 | 12/2008 |
| JP | 2013138182 | 7/2013 |
| JP | 2014062315 | 4/2014 |
| TW | 201233280 | 8/2012 |
| TW | 201524281 | 6/2015 |

OTHER PUBLICATIONS

"Office Action of Japan Counterpart Application", issued on Dec. 20, 2016, p. 1-p. 4.

* cited by examiner

CIRCUIT BOARD AND MANUFACTURING METHOD THEREOF

CROSS-REFERENCE TO RELATED APPLICATION

This application claims the priority benefit of Taiwan application serial no. 104122245, filed on Jul. 9, 2015. The entirety of the above-mentioned patent application is hereby incorporated by reference herein and made a part of this specification.

BACKGROUND OF THE INVENTION

1. Field of the Invention

The invention relates to a circuit board and a manufacturing method thereof, and particularly relates to a circuit board with preferable wire bonding and soldering capabilities and a manufacturing method thereof.

2. Description of Related Art

The conventional surface treatment layer for pads, such as an electroless plating nickel-palladium-gold layer, is formed by respectively depositing an electroless plating nickel layer, an electroless plating palladium layer, and an immersion plating gold layer on a surface of a copper pad. Alternatively, an electroless plating palladium-gold layer, is formed by respectively depositing an electroless plating palladium layer and an immersion plating gold layer on a surface of a copper pad. Such surface treatment layer normally provides a wire bonding capability and a soldering capability.

Recently, some studies indicate that an electroless plating nickel-palladium-gold layer or electroless plating palladium-gold layer that includes a pure electroless plating palladium layer or a phosphorous-less electroless plating palladium layer has a wire bonding capability slightly better than that of an electroless plating nickel-palladium-gold layer or electroless plating palladium-gold layer that includes a phosphorous-containing electroless plating palladium layer. However, the electroless plating nickel-palladium-gold layer or electroless plating palladium-gold layer that includes a phosphorous-containing electroless plating palladium layer has a soldering capability slightly better than that of the electroless plating nickel-palladium-gold layer or electroless plating palladium-gold layer that includes a phosphorous-less electroless plating palladium layer. When a product requires a preferable wire bonding capability and a preferable soldering capability at the same time, the differences in wire bonding and soldering capabilities between the electroless plating nickel-palladium-gold layer or electroless plating palladium-gold layer that includes a phosphorous-containing electroless plating palladium layer and the electroless plating nickel-palladium-gold layer or electroless plating palladium-gold layer that includes a phosphorous-less electroless plating palladium layer may cause disturbance in choosing suitable materials. Thus, how to provide the preferable wire bonding and soldering capabilities at the same time in a product is certainly an issue to work on.

SUMMARY OF THE INVENTION

The invention provides a circuit board having preferable wire bonding and soldering capabilities.

The invention also provides a manufacturing method of a circuit board for manufacturing the circuit board having preferable wire bonding and soldering capabilities.

A circuit board of the invention includes a substrate, a patterned copper layer, a phosphorous-containing electroless plating palladium layer, an electroless plating palladium layer, and an immersion plating gold layer. The patterned copper layer is disposed on the substrate and exposes a portion of the substrate. The phosphorous-containing electroless plating palladium layer is disposed on the patterned copper layer. In the phosphorous-containing electroless plating palladium layer, a weight percentage of phosphorous is in a range from 4% to 6%, and a weight percentage of palladium is in a range from 94% to 96%. The electroless plating palladium layer is disposed on the phosphorous-containing electroless plating palladium layer. Moreover, in the electroless plating palladium layer, a weight percentage of palladium is at least 99% or more. The immersion plating gold layer is disposed on the electroless plating palladium layer.

According to an embodiment of the invention, the circuit board further includes a phosphorous-containing electroless plating nickel layer disposed between the phosphorous-containing electroless plating palladium layer and the patterned copper layer. In the phosphorous-containing electroless plating nickel layer, a weight percentage of phosphorous is in a range from 6% to 12%.

According to an embodiment of the invention, the circuit board further includes a solder mask layer disposed on the substrate and at least covering the substrate. In addition, the solder mask layer has a plurality of openings, the openings expose a portion of the patterned copper layer to define a plurality of pads, and the phosphorous-containing electroless plating palladium layer, the electroless plating palladium layer, and the immersion plating gold layer are sequentially stacked on the pads.

According to an embodiment of the invention, the openings of the solder mask layer are solder mask defined (SMD) openings, and the pads exposed by the openings are solder mask defined (SMD) pads.

According to an embodiment of the invention, the openings of the solder mask layer are non-solder mask defined (NSMD) openings, and the pads exposed by the openings are non-solder mask defined (NSMD) pads.

A manufacturing method of a circuit board of the invention includes steps in the following. A substrate is provided. A patterned copper layer is formed on the substrate. In addition, the patterned copper layer covers the substrate and exposes a portion of the substrate. A phosphorous-containing electroless plating palladium layer is formed on the patterned copper layer. In addition, the phosphorous-containing electroless plating palladium layer covers the patterned copper layer, and in the phosphorous-containing electroless plating palladium layer, a weight percentage of phosphorous is in a range from 4% to 6%, and a weight percentage of palladium is in a range from 94% to 96%. An electroless plating palladium layer is formed on the phosphorous-containing electroless plating palladium layer. In addition, the electroless plating palladium layer covers the phosphorous-containing electroless plating palladium layer, and in the electroless plating palladium layer, a weight percentage of palladium is at least 99% or more. An immersion plating gold layer is formed on the electroless plating palladium layer, and the immersion plating gold layer covers the electroless plating palladium layer.

According to an embodiment of the invention, the manufacturing method of the circuit board further includes forming a phosphorous-containing electroless plating nickel layer on the patterned copper layer before forming the phosphorous-containing electroless plating palladium layer.

In addition, the phosphorous-containing electroless plating nickel layer is disposed between the phosphorous-containing electroless plating palladium layer and the patterned copper layer, and in the phosphorous-containing electroless plating nickel layer, a weight percentage of phosphorous is in a range from 6% to 12%.

According to an embodiment of the invention, the manufacturing method of the circuit board further includes forming a solder mask layer on the substrate after forming the patterned copper layer. In addition, the solder mask layer at least covers the substrate, the solder mask layer has a plurality of openings, and the openings expose a portion of the patterned copper layer and define a plurality of pads.

According to an embodiment of the invention, the openings of the solder mask layer are solder mask defined openings, and the pads exposed by the openings are solder mask defined pads.

According to an embodiment of the invention, the openings of the solder mask layer are non-solder mask defined openings, and the pads exposed by the openings are non-solder mask defined pads.

Based on above, the phosphorous-containing electroless plating palladium layer, the electroless plating palladium layer, and the immersion plating gold layer are sequentially stacked on the patterned copper layer of the circuit board according to the embodiments of the invention. The phosphorous-containing electroless plating palladium layer offers a preferable soldering capability, while the electroless plating palladium layer offers a preferable wire bonding capability. Thus, the circuit board of the invention is able to provide preferable wire bonding and soldering capabilities at the same time.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
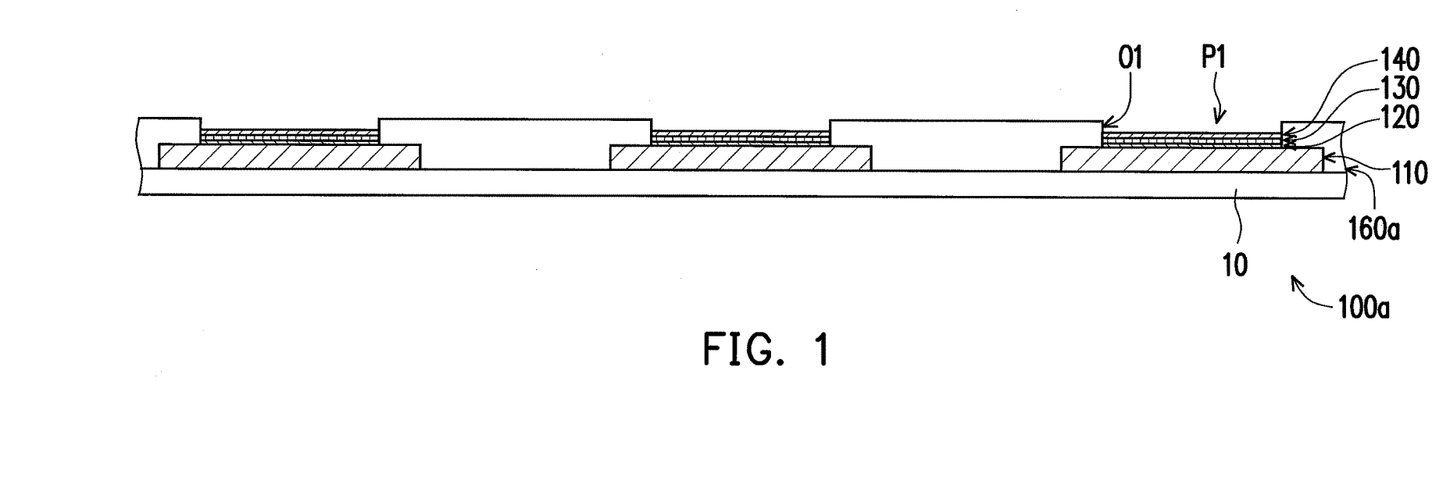
FIG. 1 is a schematic cross-sectional view illustrating a circuit board according to an embodiment of the invention.

FIG. 1 is a schematic cross-sectional view illustrating a circuit board according to an embodiment of the invention. Referring to FIG. 1, in this embodiment, a circuit board 100a includes a substrate 10, a patterned copper layer 110, a phosphorous-containing electroless plating palladium layer 120, an electroless plating palladium layer 130 (i.e. a phosphorous-less electroless plating palladium layer), and an immersion plating gold layer 140. Specifically, the patterned copper layer 110 is disposed on the substrate 10 and exposes a portion of the substrate 10. The phosphorous-containing electroless plating palladium layer 120 is disposed on the patterned copper layer 110. In addition, in the phosphorous-containing electroless plating palladium layer 120, a weight percentage of phosphorous is in a range from 4% to 6%, and a weight percentage of palladium is in a range from 94% to 96%. The electroless plating palladium layer 130 is disposed on the phosphorous-containing electroless plating palladium layer 120. Moreover, in the electroless plating palladium layer 130, a weight percentage of palladium is 99% or more. The immersion plating gold layer 140 is disposed on the electroless plating palladium layer 130.

More specifically, a material of the substrate 10 of this embodiment is an insulating material, for example. The substrate 10 may also be a single-layer circuit substrate or a multi-layer circuit substrate. The patterned copper layer 110 may be an outer wiring, for example. However, the invention is not limited thereto. Preferably, a thickness of the phosphorous-containing electroless plating palladium layer 120 is in a range from 0.03 micrometers to 0.3 micrometers, for example, a thickness of the electroless plating palladium layer 130 is in a range from 0.03 micrometers to 0.3 micrometers, for example, and a thickness of the immersion plating gold layer 140 is in a range from 0.03 micrometers to 0.2 micrometers. Besides, the circuit board 100a of this embodiment further includes a solder mask layer 160a disposed on the substrate 10 and at least covering the substrate 10. In addition, the solder mask layer 160a has a plurality of openings O1, and the openings O1 expose a portion of the patterned copper layer 110 to define a plurality of pads P1, and the phosphorous-containing electroless plating palladium layer 120, the electroless plating palladium layer 130, and the immersion plating gold layer 140 are sequentially stacked on the pads P1. In other words, the solder mask layer 160a of this embodiment extendedly covers a portion of the patterned copper layer 110 from the substrate 10, so as to define the pads P1. In addition, the phosphorous-containing electroless plating palladium layer 120, the electroless plating palladium layer 130, and the immersion plating gold layer 140 are merely disposed on the pads P1 without completely covering the patterned copper layer 110. Here, as shown in FIG. 1, the openings O1 of the solder mask layer 160a of this embodiment are implemented as solder mask defined (SMD) openings, and the pads P1 exposed by the openings O1 are implemented as solder mask defined (SMD) pads.

FIGS. 2A to 2D are schematic cross-sectional views illustrating a manufacturing method of the circuit board of FIG. 1 of the invention. First of all, referring FIG. 2A for the manufacturing method, the substrate 10 is firstly provided according to the manufacturing method of the circuit board of this embodiment. Then, the patterned copper layer 110 is formed on the substrate 10. In addition, the patterned copper layer 110 covers the substrate 10 and exposes a portion of the substrate 10. Then, referring to FIG. 2B, the solder mask layer 160a is formed on the substrate 10 and at least covers the substrate 10. In addition, the solder mask layer 160a has the openings O1, and the openings O1 expose a portion of the patterned copper layer 110 to define the pads P1. Then, referring to FIG. 2C, the phosphorous-containing electroless plating palladium layer 120 is formed on the patterned copper layer 110. In addition, the phosphorous-containing electroless plating palladium layer 120 covers the patterned copper layer 110, and in the phosphorous-containing electroless plating palladium layer 120, the weight percentage of phosphorous is in a range from 4% to 6%, and the weight percentage of palladium is in a range from 94% to 96%. Then, referring to FIG. 2C, the electroless plating palladium layer 130 is formed on the phosphorous-containing electroless plating palladium layer 120. The electroless plating palladium layer 130 covers the phosphorous-containing electroless plating palladium layer 120, and in the electroless plating palladium layer 130, the weight percentage of palladium is at least 99% or more. Lastly, referring to FIG. 2D, the immersion plating gold layer 140 is formed on the electroless plating palladium layer 130. In addition, the immersion plating gold layer 140 covers the electroless plating palladium layer 130. Accordingly, the circuit board 100a is manufactured.

Figure 2A:
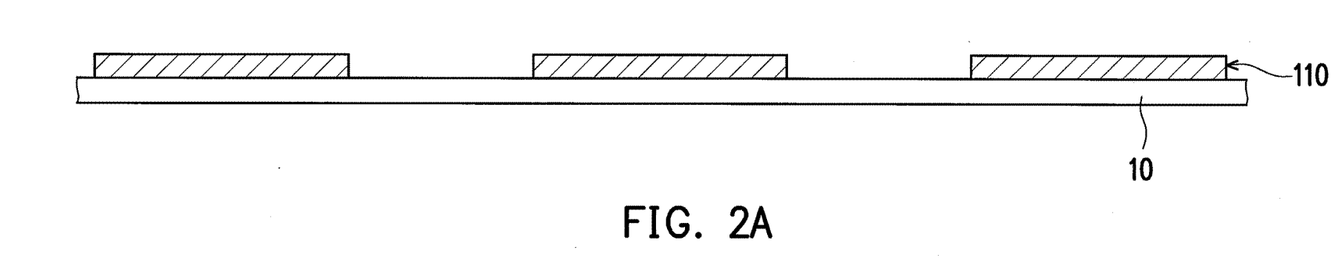
FIGS. 2A to 2D are schematic cross-sectional views illustrating a manufacturing method of the circuit board of FIG. 1 of the invention.
Figure 2B:
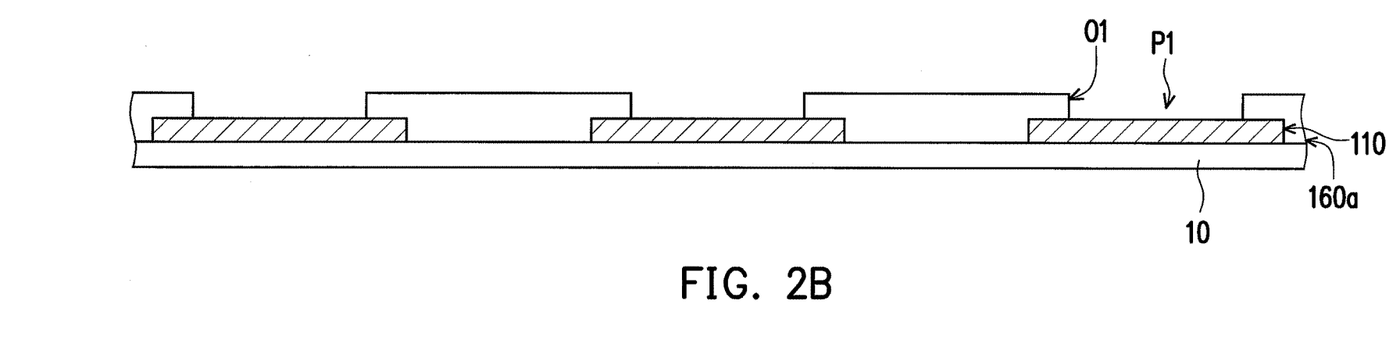
Figure 2C:
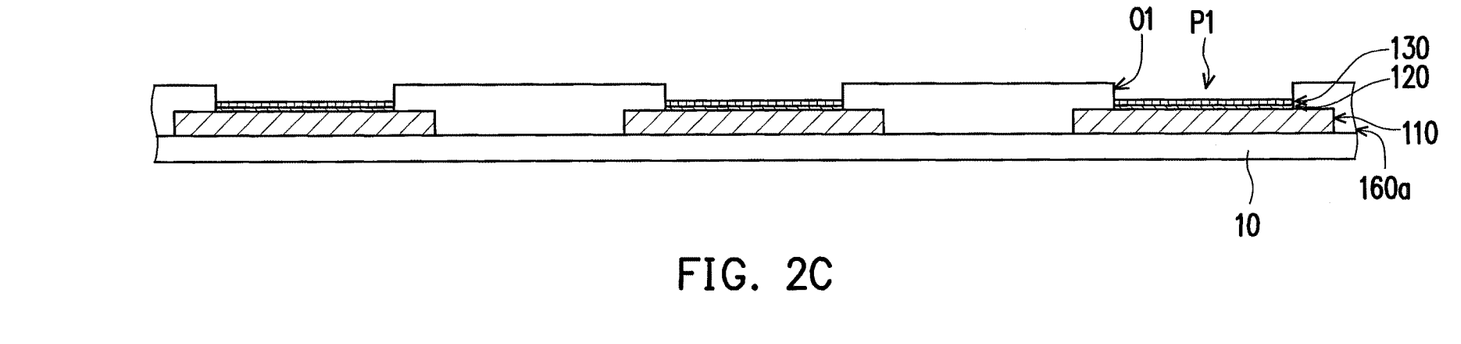
Figure 2D:
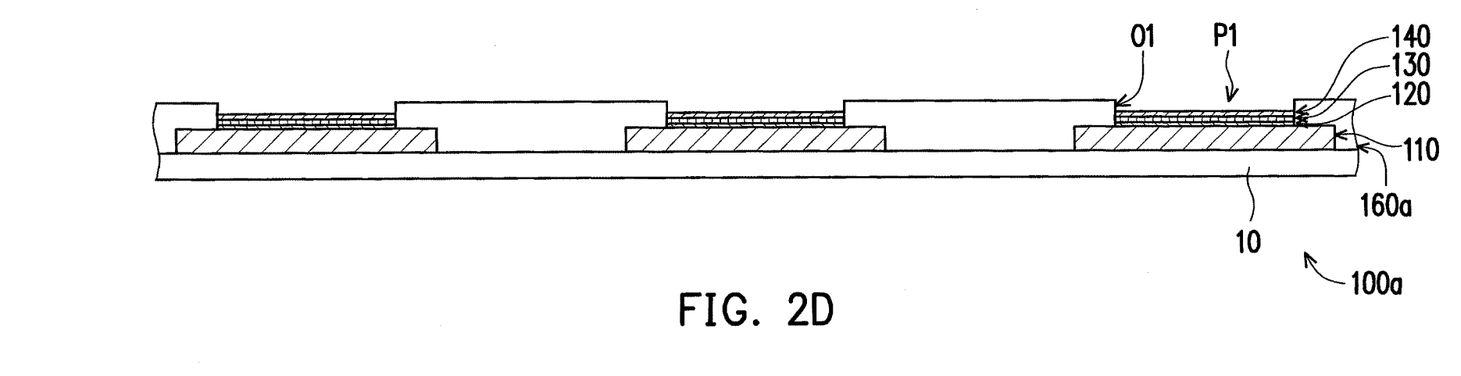
Figure 2E:
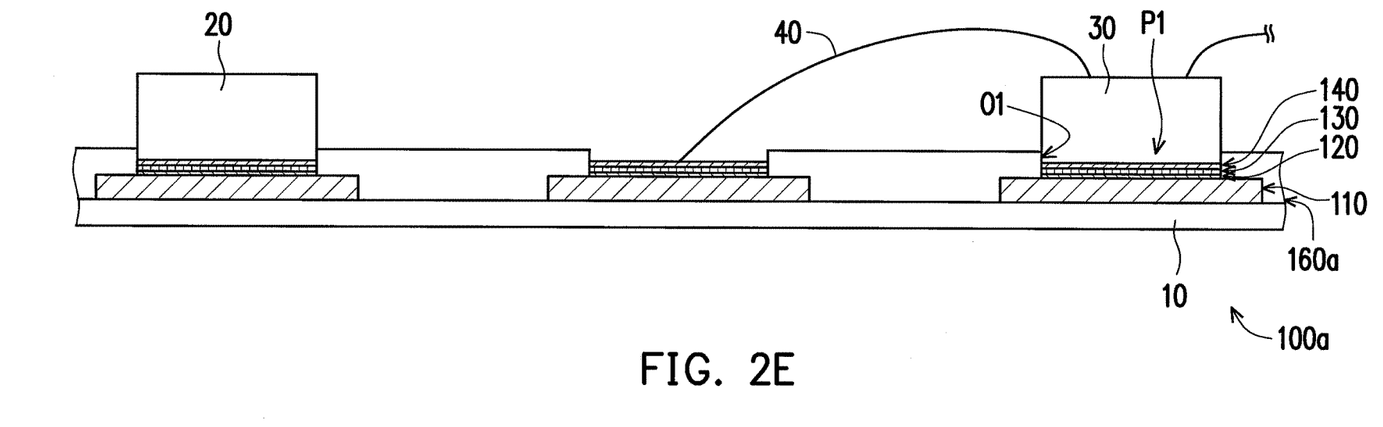
FIG. 2E is a schematic cross-sectional view illustrating a plurality of chips disposed on the circuit board of FIG. 1.

Since the phosphorous-containing electroless plating palladium layer 120, the electroless plating palladium layer 130, and the immersion plating gold layer 140 are sequentially stacked on the pads in the embodiment, and contents of phosphorous may gradually decrease from the patterned copper layer 110 to the immersion plating gold layer 140, namely a gradient change of the phosphorous contents is mild, a phosphorous content of an intermetallic metal (IMC) layer formed after a soldering process may also exhibit a mild gradient change. Accordingly, the circuit board 100a of the invention may exhibit a preferable structural reliability. Besides, referring to FIG. 2E, since the electroless plating palladium layer 130 satisfying a hardness requirement covers the pads P1 in this embodiment, when chips 20 and 30 are disposed on the circuit board 100a of this embodiment, the chip 20 is disposed on the pad through flip-chip bonding, while the chip 30 is electrically connected to the pad P1 through a wire 40. The circuit board 100a offers preferable wire bonding and soldering capabilities, so as to meet the needs to dispose chips through wire bonding and soldering at the same time. It should also be noted that while the circuit board 100a is suitable to be used in a packaging substrate, a printed circuit board, etc., the invention is not limited thereto.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 3:
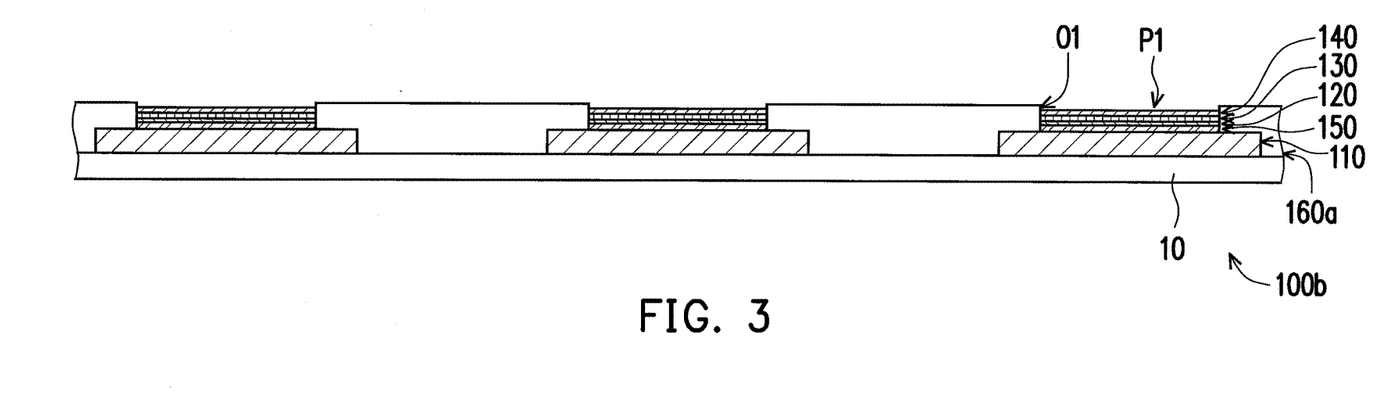
FIG. 3 is a schematic cross-sectional view illustrating a circuit board according to another embodiment of the invention.

FIG. 3 is a schematic cross-sectional view illustrating a circuit board according to another embodiment of the invention. Referring to FIGS. 1 and 3 together, a circuit board 100b of this embodiment is similar to the circuit board 100a of FIG. 1, except for the difference that the circuit board 100b of this embodiment further includes a phosphorous-containing electroless plating nickel layer 150. The phosphorous-containing electroless plating nickel layer 150 is disposed between the phosphorous-containing electroless plating palladium layer 120 and the patterned copper layer 110. Also, in the phosphorous-containing electroless plating nickel layer 150, a weight percentage of phosphorous is in a range from 6% to 12%, and a weight percentage of nickel is in a range from 88% to 94%. Preferably, a thickness of the phosphorous-containing electroless plating nickel layer 150 is in a range from 0.05 micrometers to 10 micrometers, for example, the thickness of the phosphorous-containing electroless plating palladium layer 120 is in a range from 0.03 micrometers to 0.3 micrometers, for example, the thickness of the electroless plating palladium layer 130 is in a range from 0.03 micrometers to 0.3 micrometers, for example, and the thickness of the immersion plating gold layer 140 is in a range from 0.03 micrometers to 0.2 micrometers, for example. Namely, in this embodiment, the phosphorous-containing electroless plating nickel layer 150, the phosphorous-containing electroless plating palladium layer 120, the electroless plating palladium layer 130, and the immersion plating gold layer 140 are sequentially stacked on the pads P1. In addition, the contents of phosphorous may gradually decrease from the patterned copper layer 110 to the immersion plating gold layer 140, namely the gradient change of phosphorous contents is mild. Accordingly, the phosphorous content of the intermetallic metal (IMC) layer formed after a soldering process may also exhibit a mild gradient change. Accordingly, the circuit board 100b of the invention may exhibit a preferable structural reliability.

In terms of manufacturing processes, a manufacturing method of the circuit board 100b of this embodiment is similar to the manufacturing method of the circuit board 100a of FIG. 1, except for the difference that, in this embodiment, the phosphorous-containing electroless plating nickel layer 150 is formed on the patterned copper layer 110 before formation of the phosphorous-containing electroless plating palladium layer 120, wherein the weight percentage of phosphorous is in a range from 6% to 12% in the phosphorous-containing electroless plating nickel layer 150. Then, sequentially, the phosphorous-containing electroless plating palladium layer 120 is formed on the phosphorous-containing electroless plating nickel layer 150, the electroless plating palladium layer 130 is formed on the phosphorous-containing electroless plating palladium layer 120, and the immersion plating gold layer 140 is formed on the electroless plating palladium layer 130. Accordingly, the circuit board 100b of this embodiment is manufactured.

Figure 4:
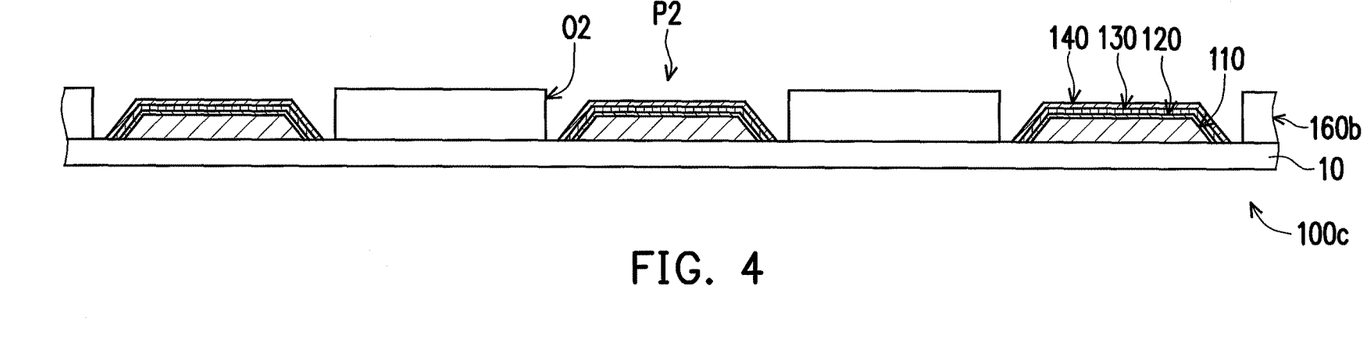
FIG. 4 is a schematic cross-sectional view illustrating a circuit board according to another embodiment of the invention.

FIG. 4 is a schematic cross-sectional view illustrating a circuit board according to another embodiment of the invention. Referring to FIGS. 1 and 4 together, a circuit board 100c of this embodiment is similar to the circuit board 100a of FIG. 1, except for the difference that a solder mask layer 160b in the circuit board 100c of this embodiment is disposed in a way different from the way that the solder mask layer 160a in the circuit board 100a in FIG. 1 is disposed. Specifically, the solder mask layer 160b of this embodiment is disposed on the substrate 10, but does not cover the patterned copper layer 110. Here, as shown in FIG. 4, openings O2 of the solder mask layer 160b are implemented as non-solder mask defined (NSMD) openings, and pads P2 exposed by the openings O2 are non-solder mask defined (NSMD) pads. In a modified embodiment, the solder mask layer 160b may also cover a peripheral portion (not shown) of the immersion plating gold layer 140, and the pads P2 exposed by the openings O2 may also be implemented as non-solder mask defined (NSMD) pads.

In terms of manufacturing processes, steps of a manufacturing method of the circuit board 100c of this embodiment are completely the same as steps of the manufacturing method of the circuit board 100a in FIG. 1. Namely, the substrate 10 is firstly provided. Then, the patterned copper layer 110 is formed on the substrate 10. In addition, the patterned copper layer 110 covers the substrate 10 and exposes a portion of the substrate 10. Then, the solder mask layer 160b is formed on the substrate 10. In addition, the solder mask layer 160b has a plurality of openings O2, and the openings O2 completely expose the patterned copper layer 110 to define the pads P2. Then, the phosphorous-containing electroless plating palladium layer 120 is formed on the patterned copper layer 110. In addition, the phosphorous-containing electroless plating palladium layer 120 covers the patterned copper layer 110, and in the phosphorous-containing electroless plating palladium layer 120, the weight percentage of phosphorous is in a range from 4% to 6%, and the weight percentage of palladium is in a range from 94% to 96%. Then, the electroless plating palladium layer 130 is formed on the phosphorous-containing electroless plating palladium layer 120. The electroless plating palladium layer 130 covers the phosphorous-containing electroless plating palladium layer 120, and in the electroless plating palladium layer 130, the weight percentage of palladium is at least 99% or more. Lastly, the immersion plating gold layer 140 is formed on the electroless plating palladium layer 130. In addition, the immersion plating gold layer 140 covers the electroless plating palladium layer 130. Accordingly, the circuit board 100c is manufactured. In a modified embodiment, the solder mask layer 160b may be manufactured after the patterned copper layer 110, the phosphorous-containing electroless plating palladium layer 120, the electroless plating palladium layer 130, and the immersion plating gold layer 140 are formed. The solder mask layer 160b may cover the peripheral portion (not shown) of the immersion plating gold layer 140, and the pads P2 exposed by the openings O2 may also be implemented as non-solder mask defined pads.

Figure 5:
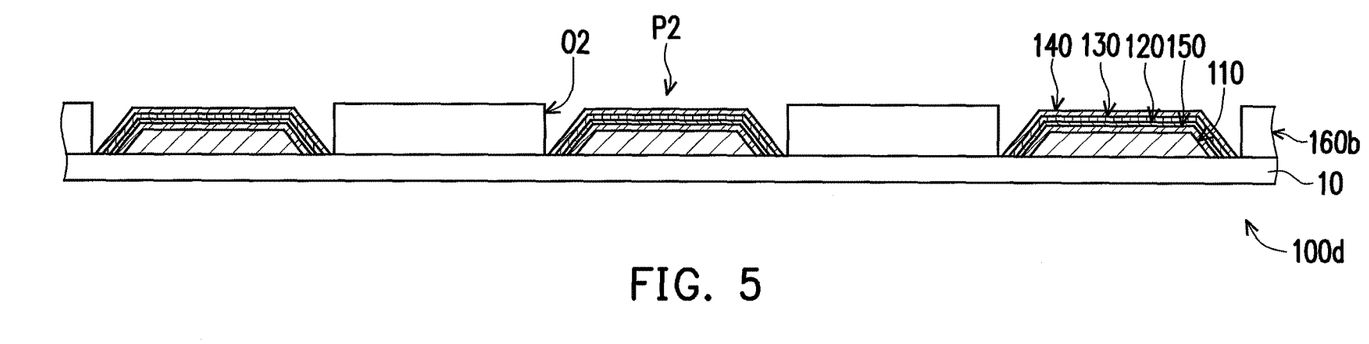
FIG. 5 is a schematic cross-sectional view illustrating a circuit board according to another embodiment of the invention.

FIG. 5 is a schematic cross-sectional view illustrating a circuit board according to another embodiment of the invention. Referring to FIGS. 4 and 5 together, a circuit board 100d of this embodiment is similar to the circuit board 100c of FIG. 4, except for the difference that the circuit board 100d of this embodiment further includes the phosphorous-containing electroless plating nickel layer 150. The phosphorous-containing electroless plating nickel layer 150 is disposed between the phosphorous-containing electroless plating palladium layer 120 and the patterned copper layer 110, and, in the phosphorous-containing electroless plating nickel layer 150, the weight percentage of phosphorous is in a range from 6% to 12%. Namely, in this embodiment, the phosphorous-containing electroless plating nickel layer 150, the phosphorous-containing electroless plating palladium layer 120, the electroless plating palladium layer 130, and the immersion plating gold layer 140 are sequentially stacked on the pads P2. In addition, the contents of phosphorous may gradually decrease from the patterned copper layer 110 to the immersion plating gold layer 140, namely the gradient change of phosphorous contents is mild. Accordingly, the phosphorous content of the intermetallic metal (IMC) layer formed after a soldering process may also exhibit a mild gradient change. Accordingly, the circuit board 100d of the invention may exhibit a preferable structural reliability.

In view of the foregoing, the phosphorous-containing electroless plating palladium layer, the electroless plating palladium layer, and the immersion plating gold layer are sequentially stacked on the patterned copper layer of the circuit board according to the embodiments of the invention. The phosphorous-containing electroless plating palladium layer offers a preferable soldering capability, while the electroless plating palladium layer offers a preferable wire bonding capability. Thus, the circuit board according to the embodiments of the invention may offer preferable wire bonding and soldering capabilities, so as to meet needs to dispose chips by wire bonding and soldering at the same time, and provide a desirable reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
   a substrate;
   a patterned copper layer, disposed on the substrate and exposing a portion of the substrate;
   a phosphorous-containing electroless plating palladium layer, disposed on the patterned copper layer, wherein in the phosphorous-containing electroless plating palladium layer, a weight percentage of phosphorous is in a range from 4% to 6%, and a weight percentage of palladium is in a range from 94% to 96%;
   an electroless plating palladium layer, disposed on the phosphorous-containing electroless plating palladium layer, wherein in the electroless plating palladium layer, a weight percentage of palladium is at least 99% or more; and
   an immersion plating gold layer, disposed on the electroless plating palladium layer.

2. The circuit board as claimed in claim 1, further comprising:
   a phosphorous-containing electroless plating nickel layer, disposed between the phosphorous-containing electroless plating palladium layer and the patterned copper layer, wherein in the phosphorous-containing electroless plating nickel layer, a weight percentage of phosphorous is in a range from 6% to 12%.

3. The circuit board as claimed in claim 1, further comprising:
   a solder mask layer, disposed on the substrate and at least covering the substrate, wherein the solder mask layer has a plurality of openings, the openings expose a portion of the patterned copper layer to define a plurality of pads, and the phosphorous-containing electroless plating palladium layer, the electroless plating palladium layer, and the immersion plating gold layer are sequentially stacked on the pads.

4. The circuit board as claimed in claim 3, wherein the openings of the solder mask layer are solder mask defined openings, and the pads exposed by the openings are solder mask defined pads.

5. The circuit board as claimed in claim 3, wherein the openings of the solder mask layer are non-solder mask defined openings, and the pads exposed by the openings are non-solder mask defined pads.

6. A manufacturing method of a circuit board, comprising:
   providing a substrate;
   forming a patterned copper layer on the substrate, wherein the patterned copper layer covers the substrate and exposes a portion of the substrate;
   forming a phosphorous-containing electroless plating palladium layer on the patterned copper layer, wherein the phosphorous-containing electroless plating palladium layer covers the patterned copper layer, and in the phosphorous-containing electroless plating palladium layer, a weight percentage of phosphorous is in a range from 4% to 6%, and a weight percentage of palladium is in a range from 94% to 96%;

forming an electroless plating palladium layer on the phosphorous-containing electroless plating palladium layer, wherein the electroless plating palladium layer covers the phosphorous-containing electroless plating palladium layer, and in the electroless plating palladium layer, a weight percentage of palladium is at least 99% or more; and forming an immersion plating gold layer on the electroless plating palladium layer, wherein the immersion plating gold layer covers the electroless plating palladium layer.

7. The manufacturing method of the circuit board as claimed in claim 6, further comprising:

before forming the phosphorous-containing electroless plating palladium layer, forming a phosphorous-containing electroless plating nickel layer on the patterned copper layer, wherein the phosphorous-containing electroless plating nickel layer is disposed between the phosphorous-containing electroless plating palladium layer and the patterned copper layer, and in the phosphorous-containing electroless plating nickel layer, a weight percentage of phosphorous is in a range from 6% to 12%.

8. The manufacturing method of the circuit board as claimed in claim 6, further comprising:

after forming the patterned copper layer, forming a solder mask layer on the substrate, wherein the solder mask layer at least covers the substrate, the solder mask layer has a plurality of openings, and the openings expose a portion of the patterned copper layer and define a plurality of pads.

9. The manufacturing method of the circuit board as claimed in claim 8, wherein the openings of the solder mask layer are solder mask defined openings, and the pads exposed by the openings are solder mask defined pads.

10. The manufacturing method of the circuit board as claimed in claim 8, wherein the openings of the solder mask layer are non-solder mask defined openings, and the pads exposed by the openings are non-solder mask defined pads.

* * * * *